(12) United States Patent
Halahmi et al.

(10) Patent No.: US 8,860,466 B2
(45) Date of Patent: Oct. 14, 2014

(54) ELECTRONIC DEVICE AND METHODE FOR IMPLEMENTING LOGIC FUNCTIONS AND FOR GUIDING CHARGED PARTICLES

(76) Inventors: Erez Halahmi, Gorgier (CH); Ron Naaman, Yarkona (IL)

( * ) Notice: Subject to any disclaimer, the term of this patent is extended or adjusted under 35 U.S.C. 154(b) by 0 days.

(21) Appl. No.: 13/980,891

(22) PCT Filed: Jan. 24, 2012

(86) PCT No.: PCT/IB2012/050334
§ 371 (c)(1),
(2), (4) Date: Jul. 22, 2013

(87) PCT Pub. No.: WO2012/101581
PCT Pub. Date: Aug. 2, 2012

(65) Prior Publication Data
US 2013/0335118 A1    Dec. 19, 2013

Related U.S. Application Data

(60) Provisional application No. 61/435,425, filed on Jan. 24, 2011.

(51) Int. Cl.
*H03K 19/00* (2006.01)
*H03K 19/06* (2006.01)
*H03K 19/20* (2006.01)
*H03K 19/21* (2006.01)

(52) U.S. Cl.
CPC ............... *H03K 19/06* (2013.01); *H03K 19/20* (2013.01); *H03K 19/21* (2013.01)
USPC ........................... 326/111; 326/101; 326/136

(58) Field of Classification Search
USPC ........................................ 326/104, 111, 136
See application file for complete search history.

(56) References Cited

U.S. PATENT DOCUMENTS

| | | | |
|---|---|---|---|
| 5,012,153 A | 4/1991 | Atkinson | |
| 5,574,438 A | 11/1996 | Kan et al. | |
| 7,545,179 B2 | 6/2009 | Diamant et al. | |
| 7,847,596 B2 * | 12/2010 | Halahmi et al. | 326/111 |
| 2008/0136455 A1 * | 6/2008 | Diamant et al. | 326/111 |

\* cited by examiner

*Primary Examiner* — Don Le (57) ABSTRACT

A device and method are presented for implementing one or more logic functions. The device comprises one or more basic blocks, each comprising a predetermined number of charged particle inputs, at least one interaction zone defining a function space, and at least one charged particle output at a certain distance from the interaction zone. The logic function is a result of an affected interaction between the charged particles.

22 Claims, 7 Drawing Sheets

ELECTRONIC DEVICE AND METHODE FOR IMPLEMENTING LOGIC FUNCTIONS AND FOR GUIDING CHARGED PARTICLES

FIELD OF THE INVENTION

The invention is generally in the field of logic gates, and relates to an electronic device and method for implementing logic functions and for guiding charged particles.

BACKGROUND

The basis of chip logic implementation is the use of two different voltages for representing logic '1' and logic '0'. Since the 1990s, most logic gates are made of CMOS transistors (i.e. NMOS and PMOS transistors are used). Often billions of logic gates are packaged in a single integrated circuit.

Some other techniques of the kind specified, developed by the inventor of the present application, utilize the principles of electron emission. For example, U.S. Pat. No. 7,847,596 describes an electronic device for performing one or more logic functions using ballistic electrons. U.S. Pat. No. 7,545,179 discloses an electronic device configured to operate as a logic gate using electrons in a vacuum and floating electrodes.

GENERAL DESCRIPTION

The inventors have found that by using charged particles (e.g. electrons or ions) which travel in time and space, the performance of logic gates can be significantly improved thus increasing the computing efficiency and its performance. According to the technique of the present invention, logic '1' is defined, for example, as the state of existence of a charged particle (electron) at a certain location, and logic '0' is defined as the state of absence of charged particle (electron) at said location. Hence, each input or output to a function is presented as the "existence" or "absence" of charged particles at a specific time and place. The function itself is a volume in space where the charged particles can interact in order to produce the output.

Choosing electrons as the charged particles gives several advantages. They are lighter than ions so they are easier to guide and manipulate. The electrostatic force is strong enough to create a change of logic state when two electrons are close one to another. Generally speaking, energy is required only for the switching the system "on", namely to produce the electrons (generally, charged particles) and provide them with initial kinetic energy. Otherwise, this CPU can run without any additional energy input. Of course, when a billion-gate scale CPU is built there is a need to guide, collect, and re-use the electrons, which will require energy. However, in principle in this new Free Particles Logic (FPL) model, energy is not required. This model can be used to implement the basic logic functions, guide and re-use electrons, scale up the number of gates, and scale down the gate size. Moreover, this concept may be integrated within any other type of CPU, for example as a subset of a CMOS CPU.

Thus, according to one aspect of the invention there is provided a method for use in implementing one or more logic functions. The method comprises affecting at least first and second flows of first and second charged particles of certain kinetic energy so as to selectively enable interaction between the first and second charged particles thereby selectively affecting location of the charged particles, to thereby selectively provide an output charged particle depending on whether said interaction has occurred or not, presence or absence of the output charged particle presenting a logic function.

In some embodiments, in order to affect the at least first and second flows to selectively enable interaction between the first and second charged particles the first flow of the at least one first charged particle to an interaction zone may be provided, while selectively supplying an input flow of the at least one second charged particle to the interaction zone, such that said at least one second charged particle arrives to a vicinity of the interaction zone substantially concurrently with arrival of said at least one first charged particle to said interaction zone.

It should be understood that the expression "substantially concurrently" used herein does not necessarily signify concurrent arrival of interacting particles to the interaction zone, but corresponds to the particles' arrival to the interaction zone with a sufficient time difference, such that a distance between them in the interaction zone for given kinetic energy(ies) of the charged particles enables desired interaction between them. Thus, the expressions "substantially concurrently" or "substantially simultaneously" used in the description below should be interpreted broadly meaning "almost concurrently" or "concurrently enough" such that a distance between them (resulting from a difference in the "time or arrival") enables the desired interaction. It should also be understood that the interaction between the first and second particles affects trajectories of propagation of the interacting particles towards the output zone (or receiving zone), thus affecting the location of the particles with respect to the output zone.

The logic functions comprise at least one of the following: at least one logic gate, a memory function, and guiding the charged particles for interconnecting different parts of an electronic device.

According to another aspect of the invention, there is provided a device for implementing one or more logic functions, wherein the device comprises one or more basic blocks, each comprising a predetermined number of charged particle inputs, at least one interaction zone defining a function space, and at least one charged particle output at a certain distance from the interaction zone, the logic function being a result of an affected interaction between the charged particles.

According to yet another aspect of the invention, there is provided a device for implementing one or more logic functions. The device comprises one or more basic blocks, each basic block comprising a predetermined number of charged particle inputs, and at least one charged particle output, the basic block being configured and operable for guiding at least two charged particles including at least one first charged particle and at least one second charged particle to selectively enable interaction between said at least two charged particles to occur determining trajectory of propagation of at least one of the interacting charged particles towards the output of the basic block, thereby affecting location of said at least one charged particle with respect to the output of the basic block, thus selectively creating a condition of presence or a condition of absence of said at least one of the interacting charged particles at the output of the basic block corresponding to a desired logic function to be implemented.

According to yet a further aspect of the invention, there is provided a processor unit comprising the above described device integral in the processor unit and configured and operable for interconnecting between different modules of the processor unit to transfer information between them. Such a processor unit may be a CPU of the conventional CMOS based system.

The basic block comprises at least one channel configured for guiding said at least one first charged particle towards the interaction zone, where this charged particle can interact with at least one second charged particle in case said second charged particle is timely supplied by the respective input to the interaction zone. It should be understood that the guiding channel which supplies the first charged particle(s) also presents the device (basic block) input. It should also be understood that in some cases one of the charged particle(s) present(s) so-called "active charged particle(s)" or "charged particle(s) provided by the system". This is generally similar to the CMOS based technique where the input to a function is "hard-wired" to logic '1' or logic '0'. As for one or more other inputs, they may also be in the form of a similar channel guiding second charged particle(s) or so-called "input charged particle(s)" presenting control signals. Such an input channel also defines an interaction region. The channels guiding first and second charged particles respectively are configured such that the first and second interaction regions are located adjacent to one another or at least partially overlap defining together said interaction zone. The second charged particle input is controlled to selectively supply the second charged particle to the vicinity of the interaction zone substantially concurrently (i.e. almost concurrently, or "concurrently enough") with arrival of said at least one first charged particle to said interaction zone in order to allow the desired interaction. Presence or absence of said at least one second charged particle in the vicinity of the interaction zone at the time the first charged particle arrives to the interaction zone (presenting a function space) equals logic '1', and absence of second charged particle at the interaction equals logic '0', and the interaction between the first and second particles in the "function space" produces the output. In other words, presence or absence of the second charged particle in the vicinity of the interaction zone at the time the first charged particle arrives to the interaction zone determines arrival or not of a charged particle to the output of the basic block, resulting in a logical output of the basic unit. As for the basic block output, this may be represented by a charged particle detector, by an input of a next basic block, or by any other next step.

Thus, according to the invention, charged particles in a vacuum are used as input(s) and output(s) of the logic gate, rather than voltages. Generally speaking, according to the invented technique, a logic function is a result of an affected interaction between charged particles, e.g. electrons or ions (which may or may not be of the same type at the device input and output). The inputs and the outputs are thus presented by charged particles' flows.

It should be understood that vacuum refers to a low enough pressure to allow the processor to function.

The number of particles used in each function depends on the desired functionality and may vary from a single up to many thousands of particles per function. Hence, the expression "charged particle" refers also to the possibility to have many particles.

Generally speaking, the charged particle channel is a hollow elongated structure, typically a narrow tubular like structure, defining an internal effective vacuum cavity (i.e. low enough pressure thus providing a long enough mean free path). The tube is made of a suitable material composition having surface charge energy higher than the kinetic energy of the charged particles being used. An example of suitable material for the channel structure is a material having negative electron affinity (NEA) such as polyethylene. The NEA property of the material provides that charged particles are not captured by the material, thus preventing the charge from penetrating inside the material, and the material of the channel guides the charged particle flow along the channel. The interaction zones (function spaces) may be defined by the layout of the tubes.

Another example of such a material is $SiO_2$ (or any other insulator for that matter). The insulator is first charged using charged particles with energy higher than the Working Energy (i.e. kinetic energy of the particles to be used in the system). For example, if the charged particles are electrons and the Working Energy is 1 eV, then at the first step electrons will pass at an energy higher than 1 eV inside the tubes, for example 10 eV ("Charging Step"). This will fill all the surface states of the insulator's tubes up to 10 eV. Then, when the working energy of 1 eV for electrons is used, the electrons will not be absorbed by the walls of the tubes because there will be no vacant state at this energy. It is preferable that the Charging Step is done with sufficiently high energy, so the device will be less influenced by thermal changes during its operation.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

Figure 1A:
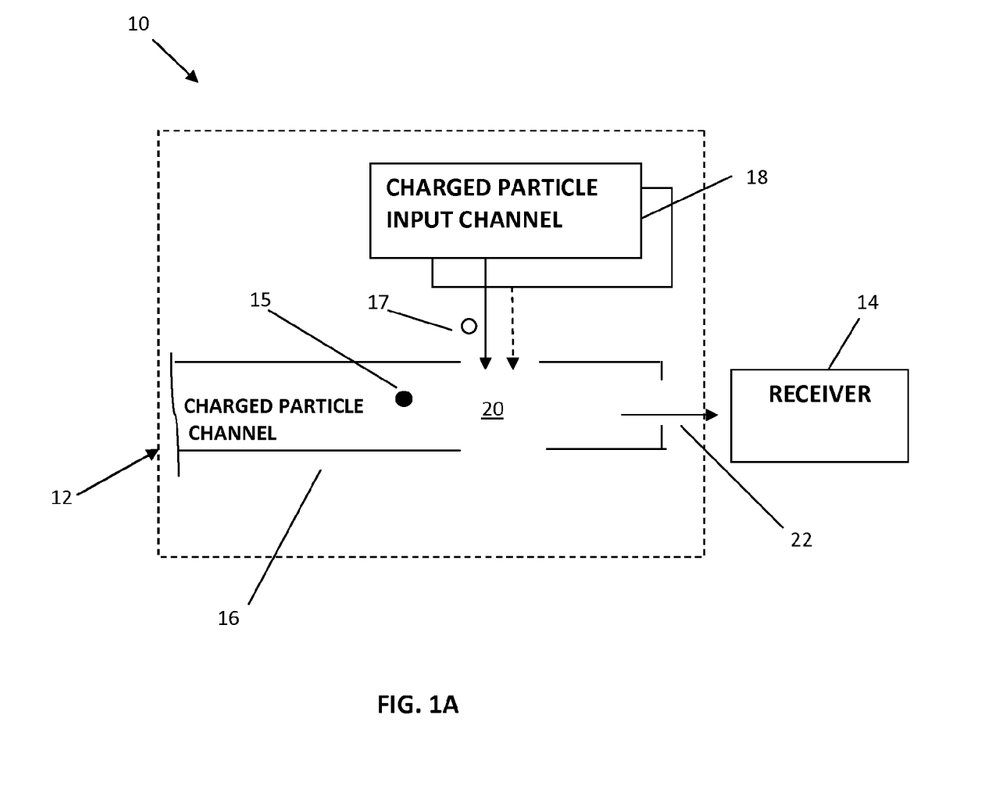
FIG. 1A illustrates a block diagram of a device of the present invention for performing one or more logic gates.

Referring to FIG. 1A, there is illustrated, by way of a block diagram, an electronic device 10 of the present invention for performing one or more logic gates. Device 10 includes one or more basic units, one such unit 12 being shown in the present example, configured and operable for implementing a logic function. As shown in the figure, an output 22 of the basic unit 12 is coupled to a receiver 14. The latter may be configured as a detector or as a next-level basic unit for implementing a further logic function, in which case the output 22 of unit 12 presents one of a number of inputs to basic unit 14.

Basic unit 12 includes one or more charged particle traps/channels 16 exposed to one or more charged particle inputs 18 and having an outlet (generally one or more outputs) 22 serving as the output of the basic unit 12. Input 18 serves to selectively provide an input signal in the form of a flow of the charged particles through the channel 16, to enable interaction between charged particles associated with different inputs. Such interaction occurs in a certain volume or space, constituting a function space. The latter may be defined by an interaction zone 20 which may for example be formed by respective regions of channels 16, or may be a region inside a specific channel. As will be described further below, input 18 to the interaction region/zone 20 of channel 16 may be constituted by adjacent or overlapping interaction zone of another similar channel.

It should be noted that a number of particles to be used in a single function may vary from a single up to many thousands of particles per function. Hence, the expression "charged particle" refers also to the possibility to have many particles.

A charged particle 15, which is at times referred to herein below as a "system particle" or "active electron", is located in the channel 16 and can propagate through the channel 16. When it arrives to the region 20, it may interact there with one or more other charged particles 17. Region 20 of the channel 16 presents the interaction zone where the intended function occurs. As indicated above, the input 18 for the particle 17 to which the interaction region 20 of channel 16 is exposed may be constituted by a similar space/region of another charged particle channel, e.g. located close to and aligned with said channel 16. Moreover, more than one instance of input 18 may be present coming from different locations and all aimed towards the interaction zone 20. The output of the basic block 12, namely presence or absence of a charged particle 15 or 17 at the output 22 of the channel 16 and accordingly at the receiver 14 depends on the interaction between particles 15 and 17 at the interaction region 20, i.e. on the presence or absence of the interaction, determining a logical output of the basic unit 12. Thus, a space/volume at the output 20 of the channel 16 presents a function itself.

It should be noted that the existence of the system particle 15 is optional and is dependent on the functionality to be achieved. Alternatively, two inputs from different locations can be used. This is exemplified below with reference to FIG. 1C.

The charged particle channels 16 are actually small tubes made of a suitable material, namely material having a surface charge energy higher than the energy of the charged particles (i.e. their kinetic energy), thus preventing the charge to penetrate inside the material. For example, materials having negative electron affinity (NEA) such as polyethylene can be used. The NEA property of the material signifies that electrons will not be captured by said material, and the material of the channel will guide them, similar to a pipe guiding water. Another example of such a material is $SiO_2$ (or any other suitable insulator) pre-charged with electrons. This will be described more specifically further below.

Figure 1B:
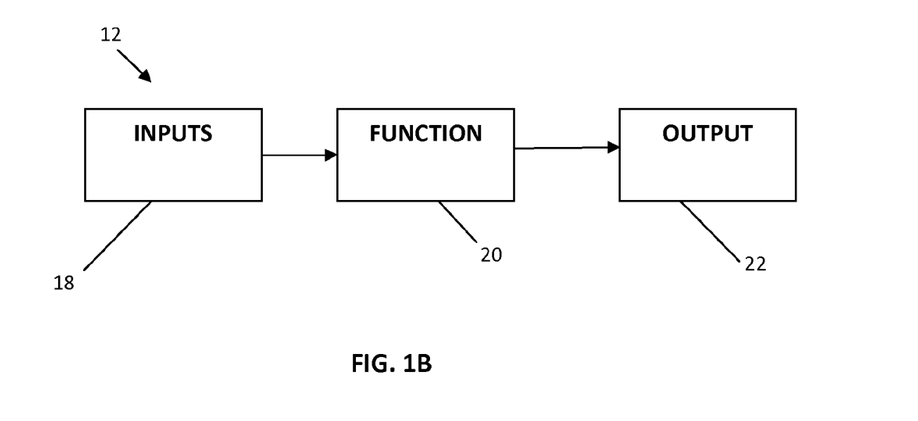
FIG. 1B schematically illustrates the functional scheme of a basic block of the device of the present invention.

FIG. 1B schematically illustrates the functional scheme of the basic block 12 of the present invention. Here, the input(s) 18 to the logical function is presented by existence or absence of a charged particle(s) (electrons) at the output volume 22 of the charged particle channel. For example, existence of electron at the input 18 equals logic '1', and absence of electron at said input equals logic '0'. In the "function space", the electron may interact with another electron thus producing the output. The electron in the channel has kinetic energy that might have been given to it when the device was turned on. The electron maintains this kinetic energy throughout the operation of the device, until it is turned off. The repulsion Coulomb force between electrons is enormous compared to other forces. Therefore, today's technology which enables to pattern nanometric cavities (function spaces) can be used allowing the function space to work even for a single electron per input.

The result of interaction occurring in the interaction region 20 is the absence or presence of electron (15 or 17 in FIG. 1A) at a certain distance from the region 20 where the output 22 of the channel is located, and where the receiver (detector) or a further channel guiding the particle can be placed. Thus, according to the technique of the invention, a change of state (logic "0" or "1") is determined by a change in the particle position (location), e.g. resulting from the particle's trajectory affected by the interaction with another particle, rather than the conventionally used change in the potential energy of a material. In other words, the invention utilizes a change in charge density in space rather than a change of the voltage of a material.

Figure 1C:
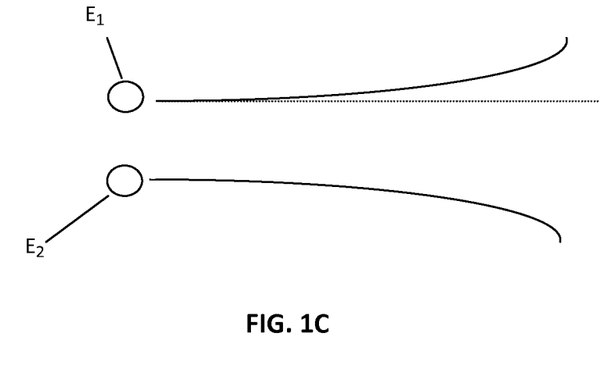
FIG. 1C exemplifies an interaction scheme between charged particles corresponding to the logic XOR function.

Reference is made to FIG. 1C illustrating schematically an interaction scheme between charged particles (electrons). In this example, the interaction corresponds to the logic XOR function.

Consider two electrons $E_1$ and $E_2$ (constituting particles 17 of FIG. 1A) having the same kinetic energy traveling in vacuum. In order to maintain their velocity, no energy is required. When they get close one to another they react by repelling each other. This repulsion is inversely proportional to the square of the distance between them (the Coulomb force). This means that only when they are "close enough" they will feel one another enough in order to interact in a detectable manner.

Different structures of tubes (channels) can implement all basic logical functions including memory function, and functions with a fan out number greater or equal to one. In order to estimate the time it takes the interaction to occur, as well as the initial distance required between the interacting electrons, several calculations were performed. The results are summarized in Table 1 below.

TABLE 1

| Initial distance between the two electrons | The time it takes the electrons to reach a distance being 3 times the initial distance |
|---|---|
| 1 μm | 0.2 ns |
| 100 nm | 5 ps |
| 10 nm | 0.2 ps |

Figure 2:
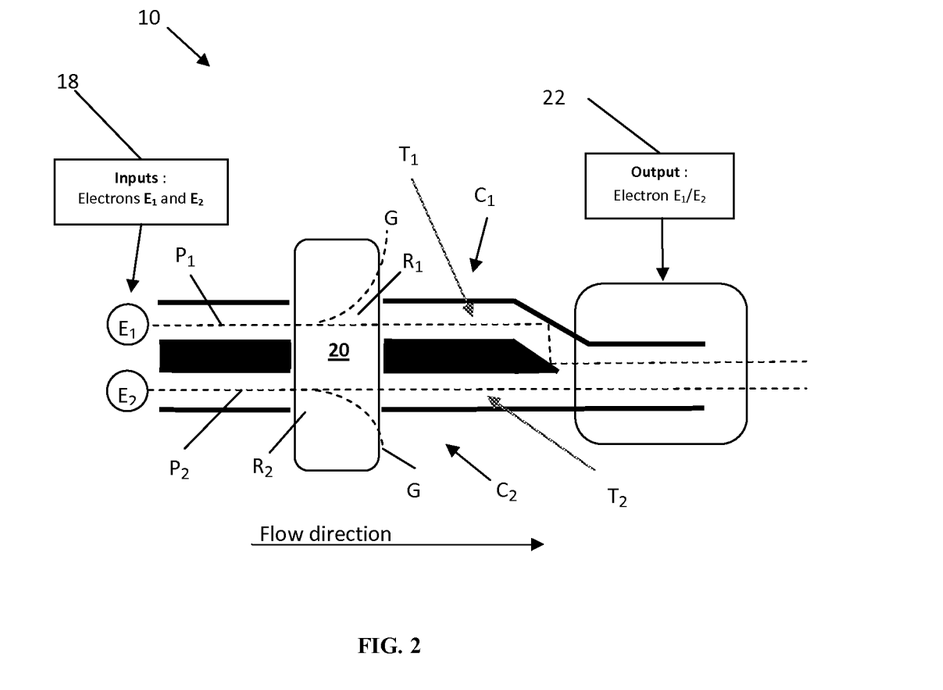
FIG. 2 shows a specific example of the configuration of the device of the present invention for performing XOR logic function based on interaction between two electrons.

As will be further explained in FIG. 2, the above represents the logical XOR function. The tube containing the result of the XOR function (i.e. the output 22 of the basic block) can further guide the electron to the input of the next logical function.

Reference is made to FIG. 2 showing a specific but not limiting example of the configuration of the device of the present invention. In the present example, the device is configured for performing XOR logic function based on two electrons $E_1$ and $E_2$ within a structure, which is maintained in a vacuum. The device 10 includes two channels $C_1$ and $C_2$ (constituting channels/inputs 16 and 18 in FIG. 1A) defined by small tubes $T_1$ and $T_2$ made of polyethylene (PE) which are placed under vacuum conditions. The PE material has NEA of around −2.92 eV.

In this specific non-limiting example, the tubes $T_1$ and $T_2$ have portions thereof extending substantially parallel to one another, and are "broken" within regions $R_1$ and $R_2$ defining free space or interaction regions 20, which, due to the relative arrangement of the tubes, enable interaction between electrons $E_1$ and $E_2$ propagating through the tubes. Such broken regions may be formed by patterning (etching) the tube structure or by coating an already patterned structure. Existence of electron $E_1$ in the interaction region 20 corresponds to an input which equals logic '1', and absence of electron $E_1$ in the interaction region 20 corresponds to an input which equals logic '0'.

As indicated above, the electrons have kinetic energy that they received before the interaction started, for example when the device was turned on, and they more or less maintain this kinetic energy throughout the operation of the device, until it is turned off. The electrons $E_1$ and $E_2$ enter into the small PE tubes, the NEA property of the PE means that electrons will not be captured by the PE material, and the PE material will guide them through the tubes. In the interaction zones 20 the electrons can interact by repelling each other due to the inherent Coulomb force.

If only electron $E_1$ or electron $E_2$ is present in the interaction region 20, then the electron will continue straight forward along path/trajectory $P_1$ or $P_2$ respectively and will exit in the tube output 22. However, if both the electron $E_1$ and the electron $E_2$ are present in the interaction zones 20, they will repel each other, affecting the trajectory of propagation to follow the trail G. In this case, no electron will enter the output tube. It should be understood that in order for this interaction to occur, both electrons should be present in the interaction zones 20 substantially simultaneously, or generally, in a close enough time. If there are no electrons entering the input, the output tube will stay empty as well.

The above described device operation is summarized in the following Table 2.

TABLE 2

| Input electrons | Action | Output tube |
| --- | --- | --- |
| Only electron $E_1$ is present | The electron $E_1$ flies following path $P_1$ and exits through the output tube 22 | Electron $E_1$ goes out |
| Only electron $E_2$ is present | The electron $E_2$ flies following path $P_2$ and exits through the output tube | Electron $E_2$ goes out |
| Both electron $E_1$ and electron $E_2$ are present | The electrons $E_1$ and $E_2$ reach the function space 20 and repel each other; they both follow the trail G | Stays empty |
| No electrons are present in the input | Nothing happens | Stays empty |

Considering now the state "electron is present" as logic '1' and the state "electron is not present" as logic '0', the following Table 3 summarizes the device operation.

TABLE 3

| input 1 (Electron $E_1$ input) | input 2 (Electron $E_2$ input) | Output |
| --- | --- | --- |
| "0" | "1" | "1" |
| "1" | "0" | "1" |
| "1" | "1" | "0" |
| "0" | "0" | "0" |

The above Table 3 represents a truth table for the logical XOR function. The tube containing the result of the XOR function (i.e. the output 22 of the basic block) can further guide the electron to the input of the next logical function or to any other next step.

Figure 3:
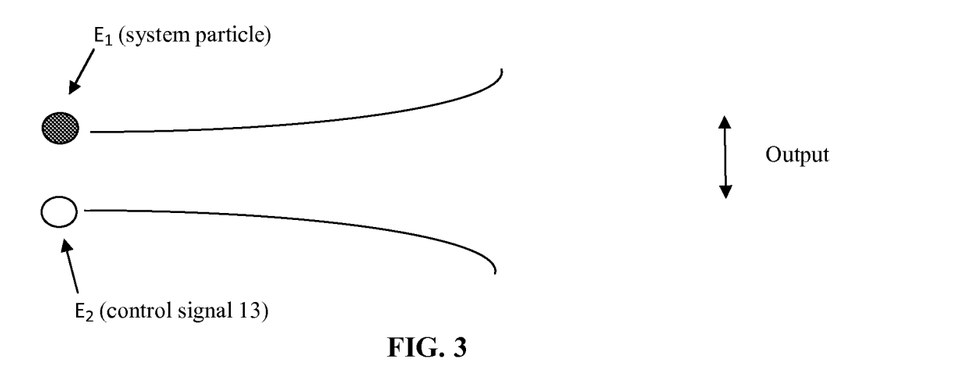
FIG. 3 exemplifies the interaction scheme for implementation of a NOT gate within the device of the present invention.

FIG. 3 shows the interaction scheme for implementation of a NOT gate (inversion function) within the device of the present invention. The dark electron $E_1$ denotes "system electron" (15 in FIG. 1A) that is supplied by the system and does not depend on the input, and the bright electron $E_2$ and Output denote the input (control) signal 13, and the output, respectively. Table 4 presents the truth table for the NOT function.

TABLE 4

| Input (electron $E_2$) | Device output |
| --- | --- |
| "0" | "1" |
| "1" | "0" |

Figure 4:
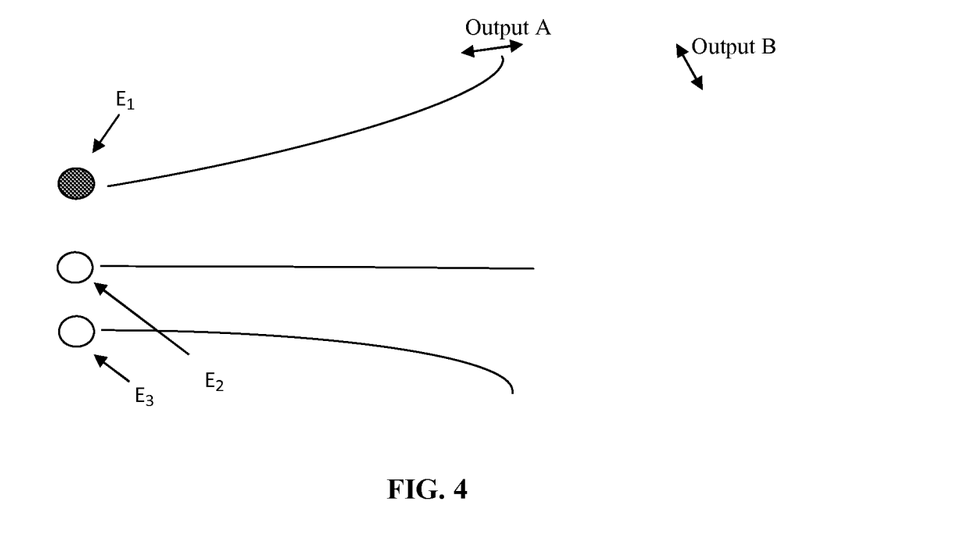
FIG. 4 exemplifies the interaction scheme for implementation of a OR/NOR gate within the device of the present invention.

FIG. 4 shows schematics of the device operation for OR and NOR functions. The electron $E_1$ is a system supplied electron (i.e. its existence is not dependent on the inputs), $E_2$ and $E_3$ are the input electrons; and output A and output B denote OR output and NOR output signals, respectively. The truth table for the OR/NOR functions is presented by Table 5 below.

TABLE 5

(the truth table for the OR/NOR functions):

| input 1 | input 2 | Output A | Output B |
| --- | --- | --- | --- |
| "0" | "1" | "1" | "0" |
| "1" | "0" | "1" | "0" |
| "1" | "1" | "1" | "0" |
| "0" | "0" | "0" | "1" |

Considering Output A as the output of this table, an OR function is obtained. If Output B is taken as the output signal, then this function implements NOR.

Note that in this function the number of inputs is not physically limited. It is sufficient that one electron will be in the input in order to divert the "system" electron $E_1$ to the output. The synchronizing of the inputs will be described further below.

It should be understood that according to the DeMorgan's Theorems, one can always use the NOR gate to implement any logical function, including AND/NAND.

Figure 5:
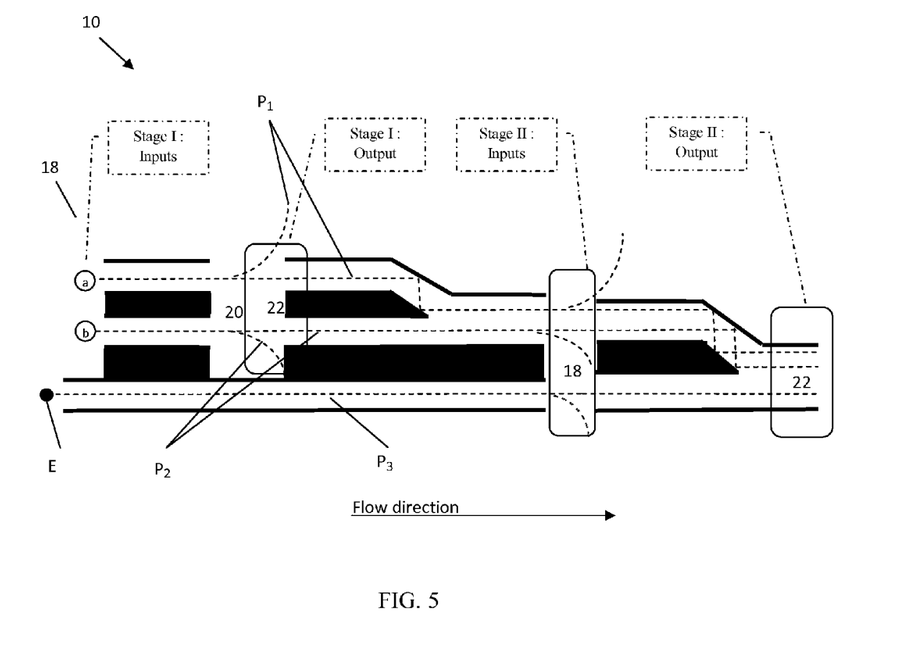
FIG. 5 exemplifies a two stages structure constructed using PE as substrate for implementing NOT and XOR gates.

It should be noted that in the scope of the present invention, several basic units, each implementing at least one logic gate, may be configured to operate in conjunction. Specifically, the output of a first logical gate may be used as an input to a second logical gate. Reference is made to FIG. 5 showing schematics on how a two stages structure may be constructed, using PE as substrate for implementing a XOR gate whose output is the input for the following NOT gate. The structure layout exemplified in the figure provides for implementing two Boolean functions; here stage I inputs 18 include inputs "a" and "b" where 'a' denotes input 1, 'b' denotes input 2; and the black circle denotes the "active" or "system" electron E which is provided in the channel and is dependent on neither 'a' nor 'b' input. The curves $P_1$, $P_2$ and $P_3$ denote the possible trajectories for charged particles entering the system at the 'a' and 'b' inputs and for system electron E, respectively. It should be noted that these can be either individual (single) electrons, or multiple electrons.

A full scale two stages small CPU can be implemented based on the above. This CPU includes NOT(XOR(a,b)) function, when "a" and "b" are inputs, as described above.

As indicated above, the electrons should preferably be guided throughout the system without losing energy. Therefore, the tube material is selected such that it allows elastic scattering of the electrons when colliding with it, e.g. suitable polymer material such as polyethylene or Parylene. Generally, such material has a Negative Electron Affinity of minimum about 1.5 eV. This allows the use of electrons up to about 1 eV. When electrons with energies lower than its affinity collide with it, the scattering is elastic.

It should also be noted that such a negative electron affinity (NEA) material, that does not allow electrons to penetrate into it if their kinetic energy is below a certain energy threshold, may be used for other applications, not only the FPL. It can be considered as an electron guide, even if the electrons do not undergo complete elastic scattering when colliding with the substrate. Moreover, the electron(s) may be inside a closed tube and travel within it according to an external field and hereby also act as a "field conductor". One example of such a usage are interconnects in CPUs. This will be exemplified further below.

It should be noted that, in all the above-described devices, in order to disable one electron interacting with another before the "interaction zone" starts, a metal can be put in their surroundings, connected to a constant potential. Alternatively, a different approach is to let the electrons of the same gate interact already inside the tubes. Then they can either continue inside the tubes all the way (e.g. tubes that split into two or more), or exit the tubes at specified locations and re-enter a continuing tube.

Electrons travelling in close channels may interact with one another and cause interferences (cross talk). This can be avoided or at least significantly reduced by adding a grounded metal layer between close channels. In order to reach high frequencies (i.e. above a few Ghz) the grounding conductors must support it, which might be a serious limitation at high frequencies. A preferred solution will be to distance the channels apart in order to avoid cross-talk. The dielectric constant of PE (2.6) assists in reducing such cross-talk.

The device of the present invention may also be configured as a memory module. Basically there are three options to implement memory modules. The straightforward one is to use the above functions as used in flip-flop. An alternative way is to locate an area across the chip in which electrons can be stored. The storage of the electrons can be either by a magnetic field that will be applied in that region, by the use of electron traps, or by having an electron capturing surface that will store the electron and release it by applying some electric potential.

Figure 6:
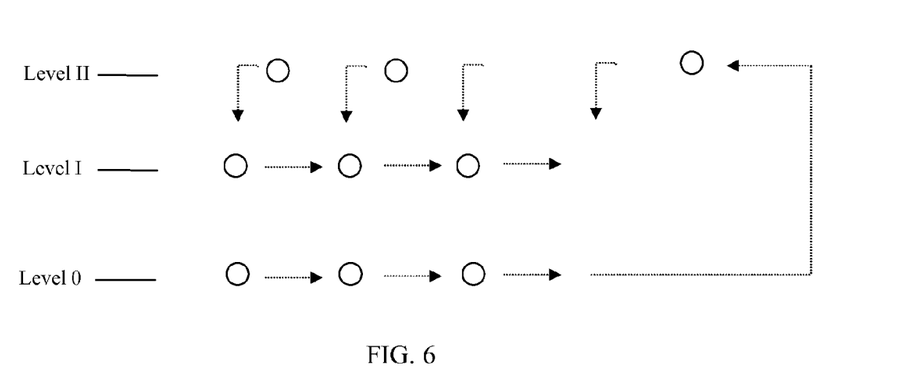
FIG. 6 exemplifies a layout of a complete CPU configured to support synchronization and reuse of electrons.

As indicated above, in order for a CPU, based on the free particle logic concept of the invention, to operate properly, all the electrons that need to interact, should preferably be synchronized. Also, the electrons should preferably be reused after the interaction time. In this connection, reference is made to FIG. 6 exemplifying a layout of a complete CPU in order to support synchronization and reuse of electrons. In general, the chip is divided into three major layers. The ground layer, "level 0" is where all the used electrons are diverted. "Level 1" is where all the interactions take place. "Level II" is the electron feed. From this level all the electrons that were used are redistributed. The control between the stages is done by an electrical field. Once arriving at the designated level, the electrons are provided with well-defined kinetic energy. After this stage, the electrons progress freely in a vacuum until they interact. The "no-longer-needed" electrons are then diverted to Level 0 and the rest continue in Level I to the next stage of logical function. The electrons from Level 0 are directed to level II for reuse. Each such cycle corresponds to a clock cycle which is made of three parts: Level II->Level I->[Level 0 or Level I]. Energy has to be invested in the diverting and directing stages. The energy used in the transition from Level I to Level 0 is very low, as the distance they need to pass is small. The biggest energy consumers are the transitions from Level II to Level I and from Level 0 to Level II which can be minimized by using a circular motion.

Using one electron per stage might not be able to drive an output line or create a fan out number greater than one (as long as quantum effects are avoided). Therefore, in these cases, electrons have to undergo a multiplication process. This can be achieved by accelerating them in a high field and causing secondary or avalanche emission from a semiconductor (as used in $3^{rd}$ generation image intensifier devices). An alternative solution is to use a greater number of electrons throughout the system (for example 100 electrons per stage). The present invention provides a novel solution for this problem, which generally may be used also for other applications where multiplication of electrons is required, such as very low light vision based on photocathodes. The basis for electron multiplication is the use of Coulomb force. Using today's technology which enables to pattern nanometric cavities, close interaction between the two or more charged particles may be created acting as an amplifier.

Figure 7:
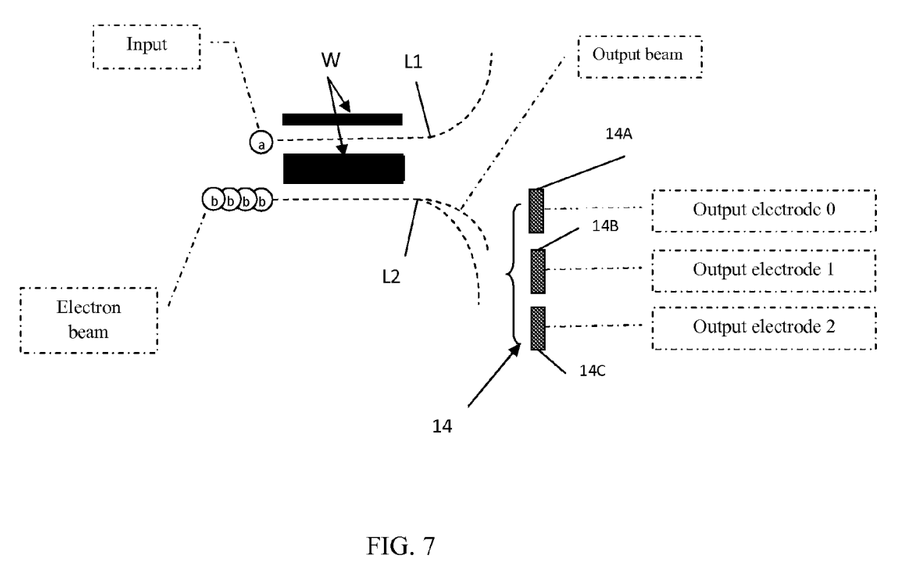
FIG. 7 exemplifies a device of the invention configured as an amplifier (electron multiplier)

Reference is made to FIG. 7 showing schematically the basic structure of such an amplifier (electron multiplier) device of the present invention. Here, 'a' denotes input signal, one electron in this case, that is to be multiplied, 'b' denotes a beam of electrons generated by a source emitting a charged particle beam with a narrow angular distribution (for example by means of field emission), and the dashed lines L1 and L2 denote the possible trajectories for 'a' and 'b', respectively. It should be noted that these can be either individual (single) electrons, or electron streams (beam). In order for the electrons to follow the trajectories denoted by lines L1 and L2 they should not be trapped by the substrate's walls W. As indicated above, in order to achieve this, a negative electron affinity (NEA) material may be used as a substrate. The receiver 14 at the device output is in the form of an array of electrodes 14A, 14B, 14C. The Coulomb force creates a large enough diversion of the output beam. If there is no input, then only 'output electrode 0' 14A will show a current. If only one electron exists in input 'a', then only 'output electrode 1' 14B will show current. If a greater number of electrons exist in input 'a', then 'output electrode 2' 14C will show current. The number of electrodes can be further increased according to the accuracy required. An alternative solution in the context of free particle logic based device, is to use a NOT gate (inverter) with more than one system ("active") electron.

Also, such NEA material may be used as a source of charged particles with very low energy variation and highly synchronized. In this connection, reference is made to FIG. 8. Here, a charged particle channel (tube) 16 is made of PE or any other NEA material. The black circles represent charged particles, generally at E, generated by a charged particle emitter (e.g. field emitter). As shown, an electrodes' arrangement 24 is appropriately provided to create a required electrical field.

Figure 8:
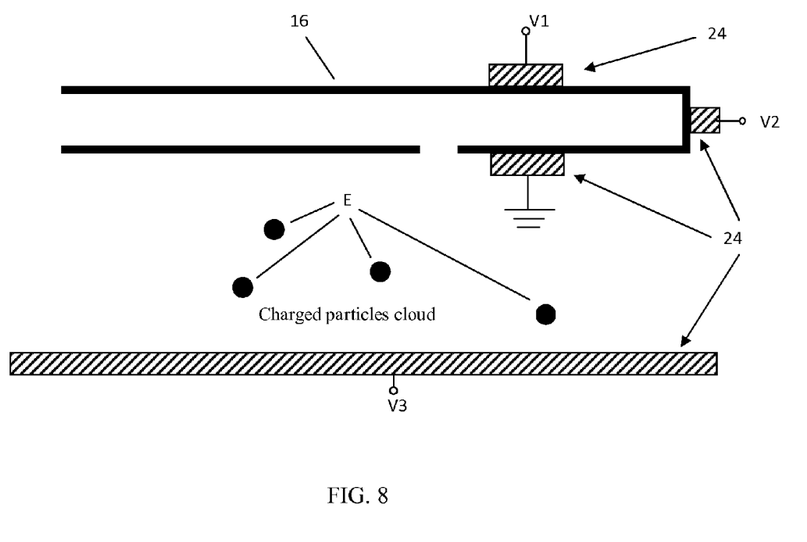
FIG. 8 schematically illustrates a device utilizing NEA material as a source of charged particles with very low energy variation and highly synchronized.

At first step, V1 is provided with positive voltage. This voltage is sufficiently high to attract one charged particle, but not more. This can be controlled by the capacitance between electrode V1 and the ground electrode. If, for example, this capacitance is in the order of $10^{-19}$F, it means that a single charged particle trapped by this electrode will change the potential between the electrodes by 1 volt. Therefore, if V1 is set to about 1V, no more than one charged particle can be trapped there. During this process V2 is kept at ground potential. V3 is kept at a small negative potential. It should be noted that there is an insulation (of the PE) to all the electrodes, meaning that the charged particles that are trapped cannot enter the electrode itself, but can only be captured by it. At the second step, the potential in V1 and V2 remains as is, while the potential of V3 changes to positive (e.g. +0.5V) in order to attract all the free charged particles. At the third step, V2 is changed to a positive value, for example +1 v. Only after the voltage on V2 is stabilized, V1 is changes to 0V. This enables the charged particle to move from V1 electrode to V2 electrode. In the fourth step, the potential on V2 is changed to −0.5 v. This will be the kinetic energy of the emitted charged particles. This sequence is summarized in the following table.

TABLE 8

| Step | V1 | V2 | V3 | Result |
|---|---|---|---|---|
| 1 | +1 v | 0 v | −0.5 v | A single charged particle is trapped by V1 electrode |
| 2 | +1 v | 0 v | +0.5 v | All the remaining free charged particles are captured by the V3 electrode |
| 3 | 0 v | +1 v | Floating | The single charged particle trapped by V1 is released and trapped by V2. In this step it is important that V2 will reach its value before changing V1. |
| 4 | 0 | −0.5 v | Floating | The single charged particle is given an initial energy equal to the value of V2 (in eV). In this step it is important to change the value of V2 across the entire tubes. This will synch all the charged particles together. |

Figure 9:
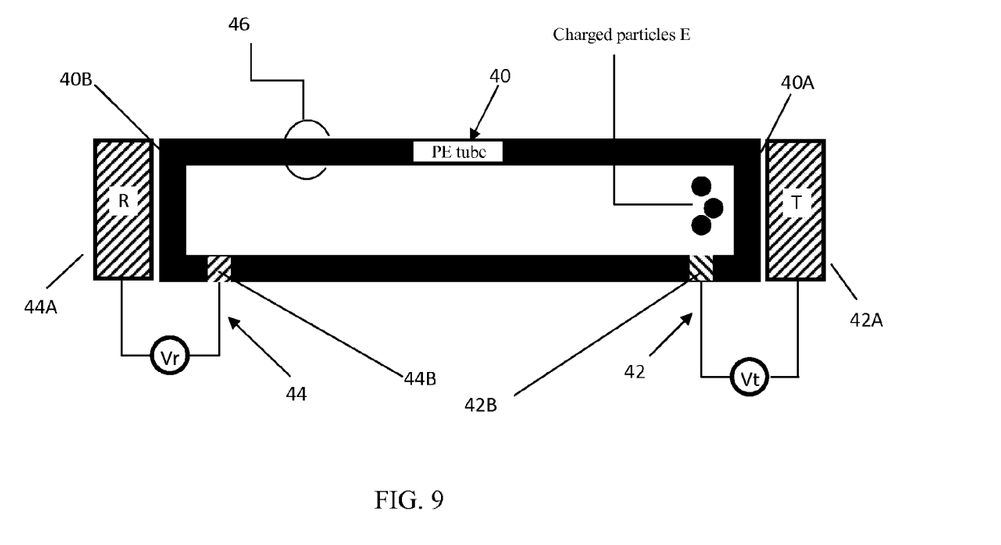
FIG. 9 illustrates schematically the interconnect based structure of the invention using PE tubes for transferring information from one conventional part of a CPU system to another.

As indicated above, charged particle(s) may be inside a closed tube of NEA material (or a pre-charged insulator) and travel within it according to an external field and thus act as a "field conductor". One example of such a usage is interconnects in CPUs. In this connection, reference is made to FIG. 9 illustrating schematically interconnect based structures using PE tubes.

Simulations have shown that that the present invention advantageously provides for implementing interconnect in current CMOS CPU for example in the form of interconnect between cores. The same technique for signal transport based on the free particle logic can be used for transferring information from one conventional part of a CPU system to another. FIG. 9 shows an example of implementing an interconnect using the above concept. This structure includes a tube 40 made of NEA material (or a pre-charged insulator) which is closed at both ends and has a vacuum inside. Charged particles, generally at E, are positioned inside the tube 40 before the tube was sealed under vacuum. The tube 40 is located between a transmitter unit 42, and a receiver unit constituted by electrodes' arrangement 44 or capacitive or inductive pickup 46. At one end 40A of the tube, being a so-called transmitting end, a field is created in order either to attract or to repel the electrons E. This can be done, for example, by using electrode's arrangement 42 including a transmitting electrode 42A and a reference electrode 42B and applying a voltage $V_t$ between these electrodes. When signal '1' is to be transmitted, voltage $V_t$ is applied to provide initial kinetic energy to the charged particles E (e.g. voltage $V_t$ is appropriately modified). The charged particles E move towards the other end 40B of the tube 40 being a so-called receiving end. This receiving end senses the arrival of the charged particles for example by a change in voltage $V_r$ between receiving and reference electrodes 44A and 44B of electrodes' arrangement 44, or by a pickup ring (capacitive or inductive pickup) 46. If signal '0' is to be transmitted, then $V_t$ keeps the charged particles at the transmitting end.

It should be noted that using different values for $V_t$ differently affect voltage $V_r$ or create different voltages in the pickup ring. This effect can be used to transmit more than one value in a single "clock cycle" (e.g., "1", "2", "3" etc.).

The same reference electrode may be used for both transmitting and receiving electrodes' arrangements. The reference electrode may be located anywhere and not necessarily in the proximity of the transmitting or receiving electrodes 42A and 44A.

The tube itself may be curved, or closed-loop (e.g. ring-like), as well as may be associated with more than one receiver. Moreover, the roles of transmitter and receiver electrodes may be interchanged according to a specific need during the operation of the CPU.

Thus, the present invention provides a novel approach for a device capable of implementing various logic functions, as well as memories and guiding of charged particles between desired locations. According to the invention, free particles' propagation in a vacuum is used as input(s) and output(s) of the logic gate, rather than voltages. Generally speaking, according to the invented technique, a logic function is a result of controlled interaction between charged particles, e.g. electrons or ions.

The invention claimed is:

1. A method for use in implementing one or more logic functions, the method comprising affecting at least first and second flows of first and second charged particles of certain kinetic energy so as to selectively enable interaction between the first and second charged particles thereby selectively affecting location of the charged particles, to thereby selectively provide an output charged particle depending on whether said interaction has occurred or not, presence or absence of the output charged particle presenting a logic function.

2. The method of claim 1, wherein said affecting of the at least first and second flows to selectively enable interaction between the first and second charged particles comprises: providing the first flow of the at least one first charged particle to an interaction zone, while selectively supplying an input flow of the at least one second charged particle to the interaction zone, such that said at least one second charged particle arrives to a vicinity of the interaction zone substantially concurrently with arrival of said at least one first charged particle to said interaction zone.

3. The method of claim 1, wherein said first and second charged particles comprise at least one of the following types: electrons and ions.

4. The device of claim 1, wherein the interacting first and second charged particles have same or different kinetic energies.

5. The method claim 1, wherein the one or more logic functions comprise at least one of the following: at least one logic gate, a memory function, guiding the charged particles for interconnecting different parts of an electronic device.

6. The method of claim 1, comprising providing the first and second particles flows through respectively first and second channels having first and second interaction regions which are adjacent or at least partially overlap to define an interaction zone.

7. The method of claim 6, wherein a material of each of the channels has a surface charge energy higher than the kinetic energy of the respective particle.

8. The method of claim 5, comprising providing initial synchronization of the charged particles in each of the channels and maintaining synchronization.

9. The method of claim 8, wherein the initial synchronization is provided by creating clouds of the charged particles and trapping the charged particles in the channels at certain starting locations in the channels, applying an electric and/or magnetic field causing absorption of excess of the charged particle by a dedicated electrode, and applying an electrical signal that provides all the trapped particles their initial kinetic energy simultaneously.

10. The method of claim 8, comprising selecting a length for each of the channels to maintain the synchronization.

11. A device for implementing one or more logic functions, wherein the device comprises one or more basic blocks, each comprising a predetermined number of charged particle inputs, at least one interaction zone defining a function space, and at least one charged particle output at a certain distance from the interaction zone, the logic function being a result of an affected interaction between the charged particles.

12. The device of claim 11, wherein the basic block has at least one of the following configurations:
 (a) is configured and operable for guiding towards the interaction zone at least two charged particles including at least one first charged particle and at least one second charged particle to selectively enable interaction between said at least two charged particles to occur in the interaction zone affecting trajectory of propagation of at least one of the interacting charged particles towards the output of the basic block, thereby affecting location of said at least one of the interacting charged particles with respect to the output of the basic block thus selectively creating a condition of presence or a condition of absence of said at least one of the interacting charged particles at the output of the basic block corresponding to a desired logic function to be implemented;
 (b) comprises at least one charged particle channel presenting the input of the basic block, the charged particle channel being configured for guiding therethrough the at least one first charged particle towards the interaction zone, where the first charged particle can interact with at least one second charged particle.

13. The device of claim 11, wherein the inputs comprise charged particle channels respectively, each having at least one interaction region, the channels being arranged such that at least one interaction region of one channel is adjacent to or at least partially overlaps with at least one interaction region of another channel to define together the interaction zone.

14. The device of claim 11, wherein the one or more logic functions comprise at least one of the following: at least one logic gate, a memory function, guiding the charged particles for interconnecting different parts of an electronic device.

15. The device of claim 11, wherein the basic block comprises at least one charged particle channel presenting the input of the basic block, the charged particle channel being a hollow elongated structure defining an internal effective vacuum cavity and being made of a material composition having surface charge energy higher than kinetic energy of the charged particles, the charged particle channel being configured for guiding therethrough the at least one first charged particle towards the interaction zone, where the first charged particle can interact with at least one second charged particle.

16. The device of claim 15, wherein said material composition has one of the following configurations: (i) comprises a material having negative electron affinity; (ii) is an insulator pre-charged with charged particles having energy higher than the kinetic energy of the interactable charged particles.

17. The device of claim 15, wherein the hollow elongated structure is made of polyethylene.

18. The device of claim 15, wherein said at least one interaction zone is defined by layout of the tubular-like members of the hollow elongated structure.

19. The device of claim 15, wherein said material composition is $SiO_2$ insulator material pre-charged with charged particles having energy higher than the kinetic energy of the interactable charged particles.

20. The device of claim 15, wherein said logic function comprises guiding the charged particles for interconnecting different parts of transistors or circuits to transfer information between them.

21. A central processor unit comprising the device of claim 11 integral in the processor unit.

22. A device for implementing one or more logic functions, the device comprising one or more basic blocks, each basic block comprising a predetermined number of charged particle inputs, and at least one charged particle output, the basic block being configured and operable for guiding at least two charged particles including at least one first charged particle and at least one second charged particle to selectively enable interaction between said at least two charged particles to occur determining trajectory of propagation of at least one of the interacting charged particles towards the output of the basic block, thereby affecting location of said at least one charged particle with respect to the output of the basic block, thus selectively creating a condition of presence or a condition of absence of said at least one of the interacting charged particles at the output of the basic block corresponding to a desired logic function to be implemented.

\* \* \* \* \*